(12) United States Patent
McClain et al.

(10) Patent No.: US 10,548,230 B2
(45) Date of Patent: Jan. 28, 2020

(54) METHOD FOR STRESS REDUCTION IN SEMICONDUCTOR PACKAGE VIA CARRIER

(71) Applicant: Micron Technology, Inc., Boise, ID (US)

(72) Inventors: Benjamin L. McClain, Boise, ID (US); Xiao Li, Boise, ID (US)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 15/862,445

(22) Filed: Jan. 4, 2018

(65) Prior Publication Data
US 2019/0208647 A1  Jul. 4, 2019

(51) Int. Cl.
| | |
|---|---|
| H01L 23/00 | (2006.01) |
| H05K 3/46 | (2006.01) |
| H01L 21/48 | (2006.01) |
| H01L 25/065 | (2006.01) |
| H01L 23/528 | (2006.01) |
| H01L 21/683 | (2006.01) |

(52) U.S. Cl.
CPC ....... *H05K 3/4682* (2013.01); *H01L 21/4857* (2013.01); *H01L 21/6835* (2013.01); *H01L 23/528* (2013.01); *H01L 24/19* (2013.01); *H01L 24/48* (2013.01); *H01L 24/73* (2013.01); *H01L 24/97* (2013.01); *H01L 25/0655* (2013.01); *H01L 2224/32225* (2013.01); *H01L 2924/0001* (2013.01); *H01L 2924/181* (2013.01)

(58) Field of Classification Search
CPC ........ H01L 23/498–49894; H01L 23/552–556
See application file for complete search history.

(56) References Cited

U.S. PATENT DOCUMENTS

2016/0276307 A1* 9/2016 Lin ..................... H01L 23/5381

\* cited by examiner

*Primary Examiner* — Daniel P Shook
(74) *Attorney, Agent, or Firm* — Parsons Behle & Latimer

(57) ABSTRACT

Semiconductor devices, semiconductor device assemblies, and methods of making such semiconductor devices and semiconductor device assemblies. Material may be removed from a semiconductor device having a first thickness to obtain a second thickness and a carrier may be attached to the semiconductor device having a third thickness with the third thickness plus the second thickness substantially equaling the first thickness. The carrier has a coefficient of thermal expansion (CTE) that differs from the CTE of the semiconductor device. The addition of the carrier to the semiconductor device may change the overall warpage or CTE of a semiconductor device assembly. The semiconductor device assembly be include a redistribution layer between the semiconductor device and a substrate. A material may encapsulate the carrier and the semiconductor device. The carrier may provide electromagnetic shielding. A coating may be applied to external surface of the semiconductor device assembly to provide electromagnetic shielding.

18 Claims, 3 Drawing Sheets

METHOD FOR STRESS REDUCTION IN SEMICONDUCTOR PACKAGE VIA CARRIER

FIELD

The embodiments described herein relate to semiconductor device, semiconductor device assemblies, and methods of making such semiconductor devices and semiconductor device assemblies. The present disclosure relates to removing material from a semiconductor device having a first thickness to obtain a second thickness and adding a carrier to the semiconductor device having a third thickness with the third thickness plus the second thickness substantially equaling the first thickness. The carrier having a coefficient of thermal expansion (CTE) that differs from the CTE of the semiconductor device.

BACKGROUND

Semiconductor processing and packaging techniques continue to evolve to meet industry demands for increased performance and reduced size. Electronic products, such as cell phones, smart phones, tablets, personal digital assistances, laptop computers, as well as other electronic devices, require packaged semiconductor assemblies having a high density of devices while having a relatively small footprint. For example, the space available for memory devices, processors, and other devices, continues to decrease in electronic products providing a need to increase the density of semiconductor devices. One method to increase the density of semiconductor devices is stacking of semiconductor devices to form a semiconductor device assembly.

During the process of forming a semiconductor device assembly, the assembly may go through various processes having an elevated temperature. For example, the temperature during a reflow process to create solder joints, or interconnections, between semiconductor devices may reach an elevated temperature, such as 260 degrees Celsius. A semiconductor device assembly may be comprised of various components such as, but not limited to, a substrate, semiconductor devices, and mold compound. Each of the components may have different coefficients of thermal expansion (CTE), which may create potential problems. As the semiconductor device assembly is subjected to an elevated temperature, the semiconductor device assembly may experience warpage due to the different CTEs of the individual components of the assembly. Warpage may provide a large amount of stress on the components of the assembly. If the warpage is too large, the warpage may create reliability issues with the interconnections within a semiconductor device assembly. CTE mismatch may also create problems in connecting a semiconductor device assembly to a board or substrate.

Additional drawbacks and disadvantages may exist.

Figure 1:
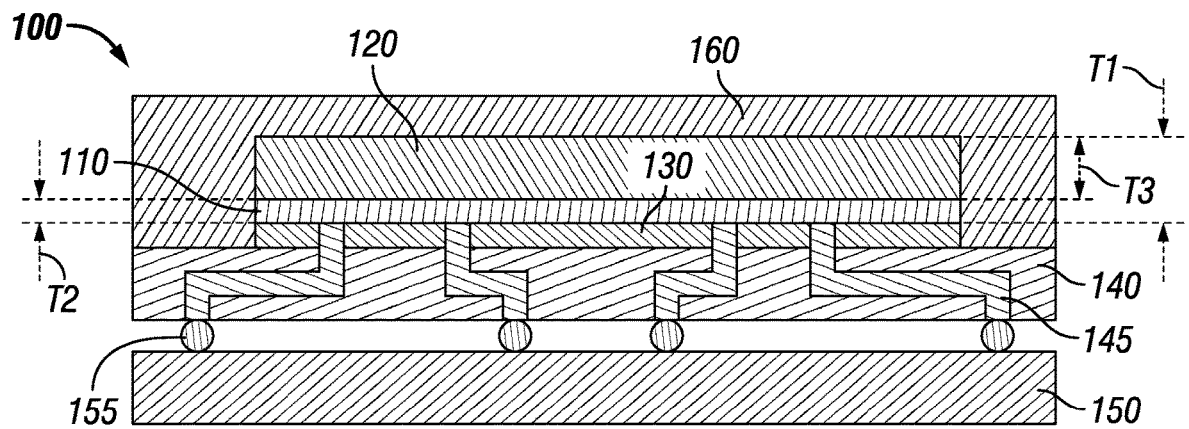
FIG. 1 is a cross-section schematic of one embodiment of a semiconductor device assembly.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure, a semiconductor device assembly comprises a semiconductor device having a second thickness with the device initially having a first thickness, wherein material has been removed from the semiconductor device until the semiconductor device has the second thickness. The semiconductor device assembly comprises a substrate connected to the semiconductor device and a carrier connected to a top surface of the semiconductor device. The carrier has a third thickness, wherein the second thickness plus the third thickness substantially equals the first thickness. Depending on the application, the third thickness could be less than, equal to, or greater than the second thickness as would be appreciated by one of ordinary skill in the art having the benefit of this disclosure. Additionally, the second thickness plus the third thickness may be less than, equal to, or greater than the first thickness depending on the application as would be appreciated by one of ordinary skill in the art having the benefit of this disclosure.

One embodiment of the disclosure is a device comprising a semiconductor device having a first CTE and having a second thickness, the semiconductor device initially having a first thickness, wherein material has been removed from the semiconductor device until the semiconductor device has the second thickness. The semiconductor device comprises a carrier connected to a top surface of the semiconductor device, the carrier having a second CTE that differs from the first CTE and a third thickness, wherein the second thickness plus the third thickness substantially equals the first thickness.

One embodiment of the disclosure is a method of making a semiconductor device assembly comprising providing a semiconductor device having a first surface and a second surface opposite the first surface, the semiconductor device having a first thickness. The method comprising removing material from the semiconductor device until the semiconductor device has a second thickness and providing a carrier material onto the first surface of the semiconductor device. The method comprises dicing the semiconductor device and carrier material into a plurality of semiconductor device assemblies.

Figure 8:
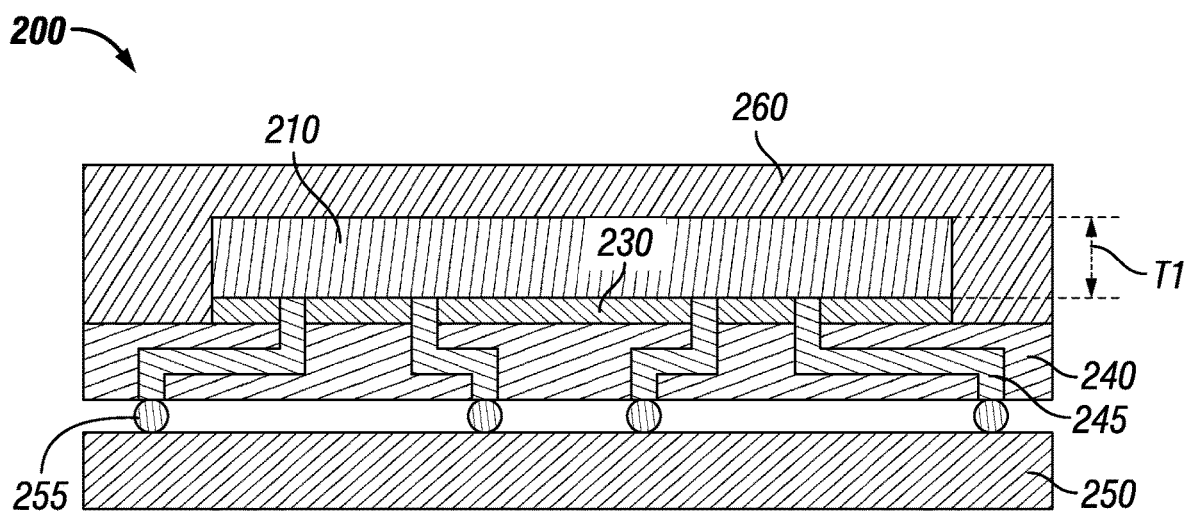
FIG. 8 is a cross-section schematic of a prior art semiconductor device assembly.

FIG. 8 shows a cross-section schematic of a prior art semiconductor device assembly 200. The semiconductor device assembly 200 comprises a semiconductor device 210 connected to a substrate 250 via a redistribution layer 240 and interconnects 255 between the redistribution layer 240 and the substrate 250. The redistribution layer 240 may be comprise of a dielectric material and includes electrical pathways or traces 245 electrically connecting the semiconductor device 210 to the substrate 250 via the interconnects 255. Underfill material 230 may be positioned between the bottom surface of the semiconductor device 210 and the redistribution layer 240 as would be appreciated by one of ordinary skill in the art. A material 260, such as mold compound, encapsulates the semiconductor device 210 and a portion of the redistribution layer 240. The semiconductor device assembly 200 may not include an encapsulation material 260 depending on the application as would be appreciated by one of ordinary skill in the art having the benefit of this disclosure. The semiconductor device 210 is shown as a single device for illustrative purposes and may be multiple device layers such as stacked semiconductor devices, stacked dies, or stacked wafers as would be appreciated by one of ordinary skill in the art having the benefit of this disclosure.

During the process of forming a semiconductor device assembly, the assembly may go through various processes having an elevated temperature. For example, the temperature during a reflow process to create solder joints, or interconnections, between semiconductor devices may reach an elevated temperature, such as 260 degrees Celsius. As shown in FIG. 8, the semiconductor devices assembly 200 is comprised of various components (i.e., semiconductor device 210, encapsulation material 260, redistribution layer 240, substrate 250) each of which may have different CTEs. As the semiconductor device assembly 200 is subjected to an elevated temperature, the semiconductor device assembly 200 may experience warpage. The semiconductor device 210 of the semiconductor device assembly 200 may be comprised of silicon and have a thickness T1. The warpage of the semiconductor device assembly 200 may be caused in large part due to the difference in CTE of the semiconductor device 210 compared to the other components of the semiconductor device assembly 200.

FIG. 1 shows a cross-section schematic of an embodiment of a semiconductor device assembly 100. The semiconductor device assembly 100 comprises a semiconductor device 110 connected to a substrate 150 via a redistribution layer 140 and interconnects 155 between the redistribution layer 140 and the substrate 150. As would be appreciated by one of ordinary skill in the art, the redistribution layer 140 may be comprised of a dielectric material and include electrical pathways or traces 145 electrically connecting the semiconductor device 110 to the substrate 150 via the interconnects 155. Underfill material 130 may be positioned between the bottom surface of the semiconductor device 110 and the redistribution layer 140 as would be appreciated by one of ordinary skill in the art. A carrier 120 is attached to a top surface of the semiconductor device 110. A material 160, such as mold compound, encapsulates the semiconductor device 110 and the carrier 120 and encapsulates and a portion of the redistribution layer 140. The semiconductor device assembly 100 may not include an encapsulation material 160 depending on the application as would be appreciated by one of ordinary skill in the art having the benefit of this disclosure. The semiconductor device 110 is shown as a single device for illustrative purposes and may be multiple device layers such as stacked semiconductor devices, stacked dies, or stacked wafers as would be appreciated by one of ordinary skill in the art having the benefit of this disclosure.

The semiconductor device 110 of the semiconductor device assembly 100 of FIG. 1 has a thickness, T2, which is less than the thickness T1 of the semiconductor device assembly 200 of FIG. 8. The thickness of the semiconductor device 110 has been reduced from an original thickness, T1, to a second thickness, T2, which reduces the affect the semiconductor device 110 will have on the warpage of the semiconductor device assembly 100 at elevated temperatures. As discussed herein, a carrier 120 is attached to the top surface of the semiconductor device 110. The carrier 120 may be attached or connected to the semiconductor device 110 in various ways as would be appreciated by one of ordinary skill in the art having the benefit of this disclosure. For example, the carrier 120 may be bonded to the semiconductor device 110.

The carrier 120 may have a thickness, T3, which when added to the thickness, T2, of the semiconductor device 110 may be substantially equal to the first, original, or initial thickness, T1, of the semiconductor device 110. The addition of the carrier 120 to the semiconductor device 110 having a second thickness, T2, so that the combined thickness is substantially equal to the first thickness, T1 (shown in FIG. 8), enables the semiconductor device 100 to have the same thickness or dimensions as the prior semiconductor device 200, which does not include a carrier 120. Depending on the application, the third thickness, T3, could be less than, equal to, or greater than the second thickness, T2, as would be appreciated by one of ordinary skill in the art having the benefit of this disclosure. Additionally, the second thickness plus the third thickness may be less than, equal to, or greater than the first thickness depending on the application as would be appreciated by one of ordinary skill in the art having the benefit of this disclosure.

The semiconductor device 110, which may be comprised of silicon, has a first CTE and the carrier 120 has a second CTE, which differs from the first CTE. The carrier 120 may be comprised of various materials, which may be selected so that the second CTE of the carrier 120 may minimize the warpage of the semiconductor device assembly 100 at elevated temperatures. The carrier 120 may be comprised of, but is not limited to, a metal, a ceramic, a metal coated with a polyimide, a polymer, a die attach film, an epoxy, or a combination thereof. As other examples, the carrier 120 may comprise, but is not limited to, copper coated with a dry film polyimide, benzocyclobutene, a die attach film, or a combination thereof. The carrier 120 may provide electromagnetic shielding to the semiconductor device 110 from above.

Figure 2:
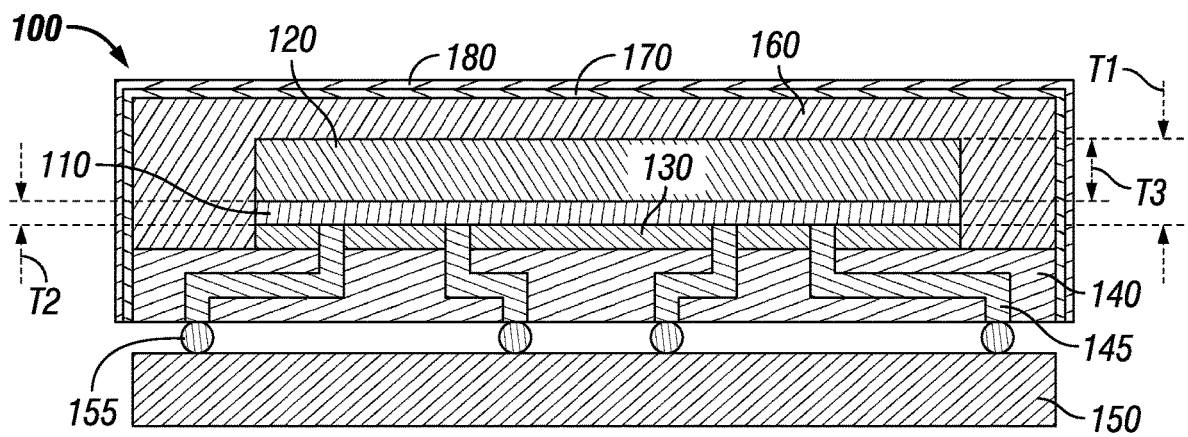
FIG. 2 is a cross-section schematic of one embodiment of a semiconductor device assembly.

FIG. 2 shows a cross-section schematic of an embodiment of a semiconductor device assembly 100 that comprises a semiconductor device 110 connected to a substrate 150 via a redistribution layer 140 and interconnects 155 between the redistribution layer 140 and the substrate 150. As discussed herein, the redistribution layer 140 includes electrical pathways or traces 145 electrically connecting the semiconductor device 110 to the substrate 150 via the interconnects 155. Underfill material 130 may be positioned between the bottom surface of the semiconductor device 110 and the redistribution layer 140. A carrier 120 is attached to a top surface of the semiconductor device 110. A material 160, such as mold compound, encapsulates the semiconductor device 110 and the carrier 120 and encapsulates and a portion of the redistribution layer 140.

As discussed herein, the carrier 120 may provide electromagnetic shielding to a portion of the semiconductor device assembly 100. Additionally, an external layer 170, 180 may be deposited on the exterior of the semiconductor device assembly 100 to provide additional electromagnetic shielding to at least a portion of the semiconductor device assembly 100. The external layer may be comprised of a first internal layer 170 and a second external layer 180. The first internal layer 170 may be comprised of a metal layer deposited on the exterior of the semiconductor device assembly 100 and the second external layer 180 may be comprised of a metal layer deposited on the first internal layer 170. The external layers 170, 180 may be comprised of various materials that may provide electromagnetic shielding as would be appreciated by one of ordinary skill in the art having the benefit of this disclosure. For example, the first internal layer 170 may be, but is not limited to, titanium or tantalum and the second external layer 180 may be, but is not limited to, copper.

The external layers 170, 180 may be deposited on all external surfaces of the semiconductor device assembly comprised of the encapsulating material 160, the carrier 120, the semiconductor device 110, the underfill material 130, and the redistribution layer 140. For example, the external layers 170, 180 may be deposited on the top surface of the encapsulating material 160 and the sides of the assembly comprised of the encapsulating material 160 and the redistribution layer 140. However, the external layers 170, 180 may be absent from the bottom surface of the redistribution layer 140, which is electrically connected to the substrate 150. If the semiconductor device assembly 100 does not include an encapsulating material 160, as discussed herein, the external layers 170, 180 may be applied to the external surfaces of the carrier 120 and the semiconductor device 110 as would be appreciated by one of ordinary skill in the art having the benefit of this disclosure.

Figure 3:
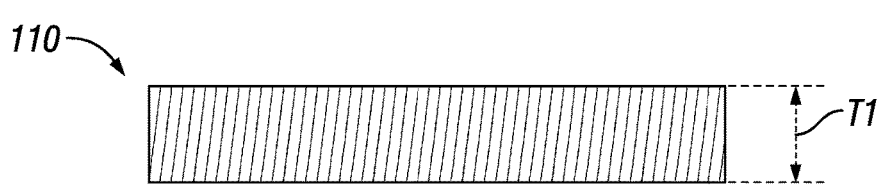
FIG. 3 shows an embodiment of a semiconductor device having a first thickness.
Figure 4:
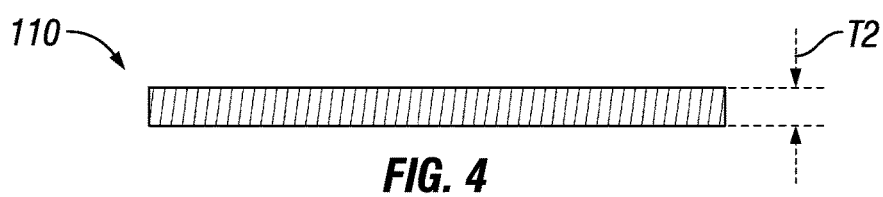
FIG. 4 shows the semiconductor device of FIG. 3 having a second thickness.

FIG. 3 shows an embodiment of a semiconductor device 110 having a first thickness, T1, which may correspond to the thickness, T1, of the semiconductor device 210 of the semiconductor device assembly 200 of FIG. 8. As discussed herein, the CTE of the semiconductor device 110 having a first thickness, T1, may result in warpage of a semiconductor device assembly of which the semiconductor device 110 is a component. Thus, it may be desired to remove some material from the semiconductor device 110, until it has a predetermined second thickness, T2. FIG. 4 shows the semiconductor device 110 with the second thickness, T2. Alternatively, the semiconductor device 110 may be fabricated to have an initial thickness equal to the second thickness, T2, to be used in combination with a carrier 120 that when added to the semiconductor device 110 has an overall thickness that is substantially equal to the first thickness, T1, as would be appreciated by one of ordinary skill in the art having the benefit of this disclosure.

Figure 5:
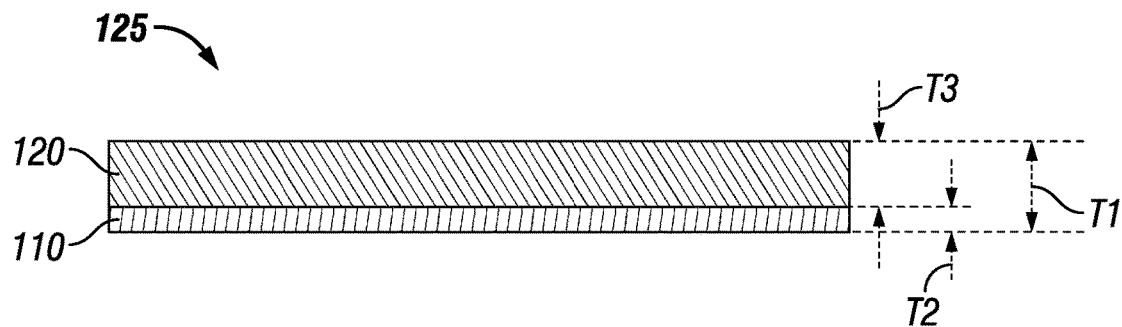
FIG. 5 shows a carrier attached to the semiconductor device of FIG. 4.

FIG. 5 shows a carrier 120 attached, or bonded, to the top surface of the semiconductor device 110. The carrier 120 has a third thickness, T3, and the semiconductor device 110 has a second thickness, T2, that when combined together the overall thickness, T1, of the carrier 120 attached to the semiconductor device 110 substantially equals the thickness, T1, of the semiconductor device of FIG. 3. Depending on the application, the third thickness, T3, could be less than, equal to, or greater than the second thickness, T2, as would be appreciated by one of ordinary skill in the art having the benefit of this disclosure. Additionally, the second thickness plus the third thickness may be less than, equal to, or greater than the first thickness depending on the application as would be appreciated by one of ordinary skill in the art having the benefit of this disclosure.

Figure 6:
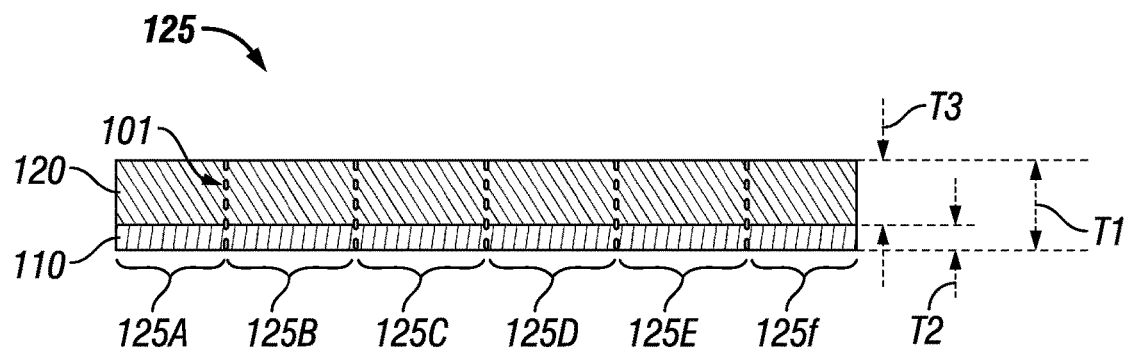
FIG. 6 shows a schematic of a plurality of semiconductor devices from the semiconductor device and carrier assembly of FIG. 5.

FIG. 6 shows a semiconductor device assembly 125 comprised of a carrier 120 and a semiconductor device 110 that has been diced or separated, shown by lines 101, into a plurality of semiconductor assemblies 125A, 125B, 125C, 125D, 125E, 125F (collectively 125). For example, the semiconductor device 110 may be a wafer which may be diced or separated, shown by lines 101, into individual dies 125A, 125B, 125C, 125D, 125E, 125F comprised of a carrier 120 bonded or attached to a semiconductor device 110. Each individual semiconductor assembly 125 may then be connected to a redistribution layer 140 to form a semiconductor device assembly 100, as shown in FIGS. 1 and 2, as would be appreciated by one of ordinary skill having the benefit of this disclosure. Various methods may be used to dice or separate the semiconductor device assembly 125 comprised of the carrier 120 and the semiconductor device 110 into a plurality of semiconductor device assemblies 125A, 125B, 125C, 125D, 125E, 125F as would be appreciated by one of ordinary skill in the art having the benefit of this disclosure. FIG. 6 shows the semiconductor device 110 diced or separated into individual dies 125A, 125B, 125C, 125D, 125E, 125F for illustrative purposes. However, the semiconductor device 110 may comprise a semiconductor wafer with a carrier 120 attached to a top surface of the semiconductor device assembly form an assembly. The second side of the semiconductor wafer may then be attached to a redistribution layer as would be appreciated by one of ordinary skill in the art having the benefit of this disclosure.

Figure 7:
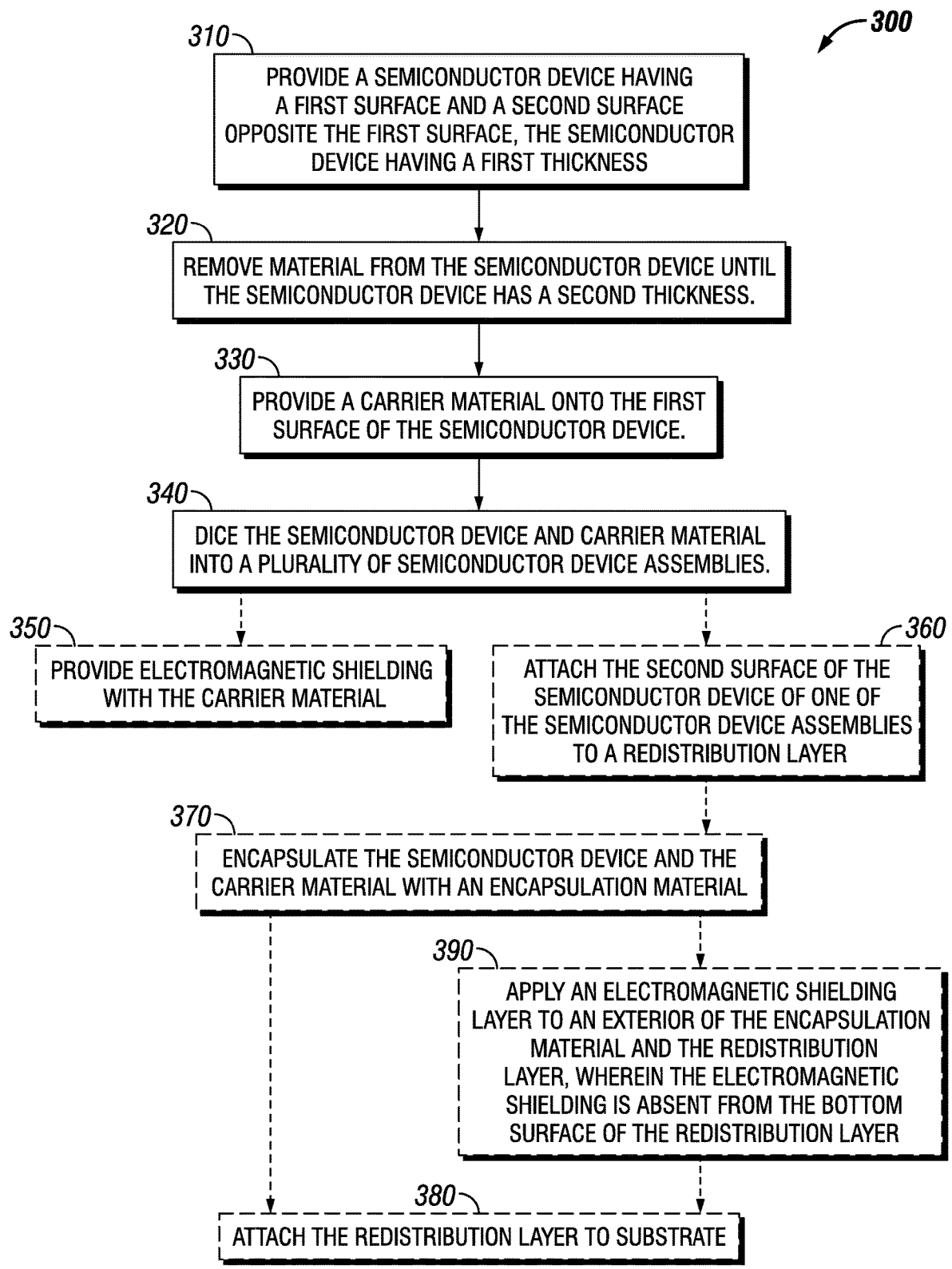
FIG. 7 is a flow chart of one embodiment of a method of making a semiconductor device assembly.

FIG. 7 is a flow chart of one embodiment of a method 300 of making a semiconductor device assembly. The method 300 includes providing a semiconductor device having a first surface and a second surface opposite the first surface, the semiconductor device having a first thickness, at 310. At 320, the method 300 comprises removing material form the semiconductor device until the semiconductor device has a second thickness. The method 300 includes providing a carrier material onto the first surface of the semiconductor device, at 330. As discussed herein, the thickness of the carrier material is substantially equal to the thickness of material removed from the semiconductor device, at 320. Alternatively, the semiconductor device may be initially provided having the second thickness, which is less than the thickness than the thickness of a semiconductor device used in a prior semiconductor device assembly with the thickness of the carrier material added to make up the difference. Depending on the application, the third thickness could be less than, equal to, or greater than the second thickness as would be appreciated by one of ordinary skill in the art having the benefit of this disclosure. Additionally, the second thickness plus the third thickness may be less than, equal to, or greater than the first thickness depending on the application as would be appreciated by one of ordinary skill in the art having the benefit of this disclosure.

The method 300 includes dicing, or separating, the semiconductor device and carrier material into a plurality of semiconductor device assemblies, at 340. Alternatively, the method 300 may include dicing, or separating, the semiconductor device and carrier into a plurality of semiconductor device assemblies after the semiconductor device is attached to a redistribution layer, at 360, as would be appreciated by one of ordinary skill in the art having the benefit of this disclosure. Optionally, the method 300 may include providing electromagnetic shielding with the carrier material, at 350. The method 300 may optionally include attaching the second surface of the semiconductor device of one of the semiconductor device assemblies to a redistribution layer, at 360, and optionally encapsulating the semiconductor device and the carrier material with an encapsulation material, at 370. The method 300 may include attaching the redistribution layer to a substrate, at 380. Attaching the redistribution layer may comprise various methods of connecting the redistribution layer to the substrate. For example, attaching the redistribution layer to the substrate may comprise depositing the redistribution layer to the substrate as would be appreciated by one of ordinary skill in the art having the benefit of this disclosure. The method 300 may include applying an electromagnetic shielding layer to an exterior of the encapsulation material and the redistribution layer, at 390, and then attaching the redistribution layer to a substrate, at 380. The electromagnetic shielding layer may be absent from a bottom surface of the redistribution layer.

As disclosed herein, the use of a carrier 120 connected to a semiconductor device 110 may reduce the warpage of a semiconductor device assembly 100 without changing the overall dimensions of the semiconductor device assembly 100. Various materials may be used for the carrier 120 as would be appreciated by one of ordinary skill in the art having the benefit of this disclosure. The material of the carrier 120 may be selected based on the CTE of the material. Likewise, the material of the carrier 120 may also be selected based on providing electromagnetic shielding. An external layer or layers 170, 180 may be deposited on the exterior of the semiconductor device assembly 100 to provide additional electromagnetic shielding to at least a portion of the semiconductor device assembly 100.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
    a semiconductor device, the semiconductor device having a second thickness, the semiconductor device initially having a first thickness, wherein material has been removed from the semiconductor device until the semiconductor device has the second thickness;
    a substrate, the semiconductor device being connected to the substrate; and
    a carrier connected to a top surface of the semiconductor device wherein the semiconductor device is positioned between the substrate and the carrier, the carrier having a third thickness, wherein the second thickness plus the third thickness substantially equals the first thickness.

2. The assembly of claim 1, further comprising a redistribution layer between the semiconductor device and the substrate.

3. The assembly of claim 2, the redistribution layer comprising a plurality of traces positioned within a dielectric material.

4. The assembly of claim 3, further comprising underfill material positioned between the semiconductor device and the redistribution layer.

5. The assembly of claim 4, further comprising a material that encapsulates the semiconductor device and the carrier.

6. The assembly of claim 5, further comprising an exterior layer on the encapsulating material and the redistribution layer, the exterior layer providing electromagnetic shielding.

7. The assembly of claim 6, wherein the exterior layer is absent between the redistribution layer and the substrate.

8. The assembly of claim 7, wherein the exterior layer comprises a first internal metal layer and a second external metal layer that differs from the first internal metal layer.

9. The assembly of claim 8, wherein the first internal metal layer comprises titanium or tantalum and the second external metal layer comprises copper.

10. The assembly of claim 1, wherein the semiconductor device has a first coefficient of thermal expansion (CTE) and the carrier has a second CTE that differs from the first CTE.

11. The assembly of claim 10, wherein the semiconductor device comprises silicon.

12. The assembly of claim 11, wherein the carrier comprises one of a metal, a ceramic, a metal coated with a polyimide, a polymer, a die attach film, an epoxy, or a combination thereof.

13. The assembly of claim 1, wherein the carrier comprises one of a metal, a ceramic, a metal coated with a polyimide, a polymer, a die attach film, an epoxy, or a combination thereof.

14. The assembly of claim 1, wherein the carrier comprises one of copper coated with a dry film polyimide, benzocyclobutene, or a die attach film.

15. A semiconductor device comprising:
- a semiconductor device having a top surface and a bottom surface opposite the top surface, the semiconductor device having a first coefficient of thermal expansion (CTE) and having a second thickness, the semiconductor device initially having a first thickness, wherein material has been removed from the semiconductor device until the semiconductor device has the second thickness; and
- a carrier connected to the top surface of the semiconductor device, the carrier having a second CTE that differs from the first CTE and a third thickness; and
- wherein the bottom surface of the semiconductor device is configured to be electrically connected to a substrate.

16. The device of claim 15, wherein the second thickness plus the third thickness substantially equals the first thickness.

17. The device of claim 16, wherein the semiconductor device comprises silicon and the second CTE differs from a CTE of silicon.

18. The device of claim 17, wherein the carrier comprises one of a metal, a ceramic, a metal coated with a polyimide, a polymer, a die attach film, an epoxy, or a combination thereof.

* * * * *